US 6,561,835 B1

(12) United States Patent
Hirschberg et al.

(10) Patent No.: US 6,561,835 B1
(45) Date of Patent: May 13, 2003

(54) APPARATUS AND METHOD FOR USING A BACKSHELL

(75) Inventors: Robert N. Hirschberg, Glendale, AZ (US); Roger A. Baerman, Glendale, AZ (US); John W. Bodle, Phoenix, AZ (US); Brett A. Eddy, Phoenix, AZ (US); Rob Overman, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/999,351

(22) Filed: Nov. 15, 2001

(51) Int. Cl.[7] .............................................. H01R 13/627
(52) U.S. Cl. ...................................... 439/362; 439/341
(58) Field of Search ................................ 439/362, 341, 439/378, 374, 680, 681, 607, 608, 609, 610, 928, 95, 108, 376, 532

(56) References Cited

U.S. PATENT DOCUMENTS

| | | | | |
|---|---|---|---|---|
| 2,669,702 A | * | 2/1954 | Klostermann | 339/196 |
| 3,277,426 A | * | 10/1966 | Klostermann | 339/192 |
| 3,657,682 A | * | 4/1972 | Iversen | 339/103 |
| 3,764,957 A | * | 10/1973 | Iversen | 339/92 |
| 4,579,415 A | | 4/1986 | Van Brunt et al. | |
| 4,842,543 A | * | 6/1989 | Davis | 439/378 |
| 4,865,560 A | * | 9/1989 | Thomas | 439/341 |
| 5,348,482 A | | 9/1994 | Rudy, Jr. et al. | |
| 5,788,528 A | | 8/1998 | Orr, Jr. et al. | |
| 5,855,493 A | | 1/1999 | Shelly | |
| 5,911,595 A | | 6/1999 | Orr, Jr. et al. | |
| 5,961,348 A | | 10/1999 | Murphy | |
| 5,966,023 A | * | 10/1999 | Burgers et al. | 324/761 |
| 6,217,360 B1 | * | 4/2001 | Parent | 439/341 |
| 6,234,828 B1 | * | 5/2001 | Kuo | 439/358 |

* cited by examiner

*Primary Examiner*—Renee Luebke
*Assistant Examiner*—Alexander Gilman

(57) ABSTRACT

A backshell for forming an electrical connection with a cabinet, the backshell including at least one electrical connector, a deflection arm coupled to one end of the backshell for engaging a cam on a cabinet which holds a receiving connector, and a fastener on the opposite end of the backshell from the deflection arm. The deflection arm provides a clamping force when the fastener is fully engaged, and helps form a strong mechanical connection.

23 Claims, 8 Drawing Sheets

APPARATUS AND METHOD FOR USING A BACKSHELL

BACKGROUND OF THE INVENTION

1. Technical Field

The present invention relates generally to electronic signal connectors and, more particularly, to a backshell configuration for providing a mechanical connection for communicating signals in a rigorous vibration environment.

2. Background Information

Electrical connections are commonly used in transmitting signals and data between computers, systems and other devices. Typically, one device is connected to another device or system through a single wire or multiple wires. In many instances, a cable bundle containing these wires terminates in a mechanical housing, also known as a backshell, which provides physical protection for each wire in the cable bundle to each pin in an apparatus for making mated connections in the connected device. A backshell also protects the wires and connectors from fatigue. For example, FIG. 1 shows a typical prior art connection between a device 10 and a cable bundle 20 containing multiple wires 22. The cable bundle 20 terminates in a mechanical housing also known as a backshell 30. Generally, some form of mechanical connection is provided to prevent the backshell from becoming disconnected from the connected device and to maintain the signal contact at all times. For example, in the exemplary embodiment shown in FIG. 1, two No. 4 size screws 40 are provided with thumb adjustment knobs to provide this mechanical connection.

U.S. Pat. Nos. 4,579,415, 5,348,482, 5,788,528, 5,855,493, 5,911,595, 5,961,348 discuss typical backshell constructions, magnetic grounding techniques in backshells, cable strain relief techniques, and the cabinets to which the backshell connectors may be attached. The general functionality of these patents is incorporated by reference as background information.

While this sort of connection may be sufficient in some applications, a large number of situations exist where the environment provides particularly challenging conditions which may cause the mechanical connection to fail. The failures may be a permanent disconnection of the wires resulting in a permanent interruption in the signals being transmitted or communicated, or may be temporary or intermittent open circuits which distort or destroy the signal integrity. In many applications, even a momentary disruption in signal integrity can have very undesirable results.

Electrical connections which are made between avionics devices are often subject to a rigorous vibrational environment. For example, helicopters and fixed-wing aircraft experience a broad range of vibrations and temperature swings. These vibrations may loosen the connectors 40 over a period of time, such as by unscrewing or stripping the threads of connectors 40. Also, the small No. 4 size screws 40 can slip and fail to maintain the connection under rigorous environmental conditions. Furthermore, the vibrations may cause the connection point between the wires of the device and the wires in the backshell to disengage unless constant pressure keeps the wires held together. Although the present discussion focuses primarily on the rigorous vibrational environments found in fixed-wing aircraft and helicopters, similarly challenging environments may be found in pumps, fans, motors, and other large machinery found, for example, on oil rigs, shop floors, and other such high vibration applications. Furthermore, connections between cable bundles and electrical devices may be challenged by other environmental factors such as high temperatures, or large temperature changes, low and high humidity conditions and electromagnetic radiation environments. For all of these conditions, it is desirable to have a strong mechanical connection to maintain signal integrity.

Connections in avionics devices typically use an ARINC 404 connector such as, for example, a DPX model connector available from Cannon, mil number, MIL-C-81659. ARINC stands for Air Radio Inc. ARINC 404 is a specification, known to those of skill in the art, that defines air transport avionics equipment interfaces. ARINC 404 connectors tend to perform well in the high vibration environment found in avionics. However, due to the use of smaller and lighter devices and systems in aircraft, some manufacturers have moved away from the ARINC 404 connectors and have begun manufacturing devices that require connectors such as the D subminiature connectors. These D subminiature connectors, when attached by methods of the prior art, may not be mechanically robust and may lack the ability to provide a reliable signal. Furthermore, the prior art D subminiature type connectors are bulky, often difficult to install, and lack packaging efficiency.

The trend in avionics is to use smaller and lighter components to improve the performance of aircraft. Thus, manufacturers have combined multiple devices into smaller packages. One difficulty that has been encountered with the use of the D subminiature connectors is that cabinet 15 (such as the cabinet illustrated in FIG. 1) which contains one or more devices 10 is typically very small and leaves little room for accessing the thumb screws 40. Moreover, standard backshells are a difficult fit in congested avionics bays.

The tight spacing tolerances also make it difficult to use the standard D subminiature connectors because in some situations, the cabinet 15 may be located so close to device 10 that, although there is room for the backshell 30 between the device 10 and cabinet door 16, there may not be room for the cable bundle 20 to come out of end 32 of backshell 30 so as to not interfere with the closing of the cabinet door 16. This interference, for example, can be shown in FIG. 1 at interference point 28. It will be readily appreciated, however, that if cable bundle 20 exits backshell 30 on either top side 34 or bottom side 36, it would be more difficult to access connectors 40 to tighten backshell 30 to device 10. In some situations, more than one connector is attached to the device 10. When these connections are in line and close together, it is harder still to obtain access to the mechanical fasteners.

Moreover, the screws 40 used to attach standard D subminiature connectors are limited to the small No. 4 size screws that fit into standard D subminiature threaded screw receiving holes in the mating D subminiature connector. Therefore, it has been difficult to provide a means of mating the D subminiature connector with any other fastener other than these small screws, and it has thus been difficult to form a connection which can withstand the rigorous vibration environments found in aircraft avionics bays.

Therefore, a need exists for an integrated backshell that fits the tight confines of avionics bays while allowing access to the connectors. A further need exists for an integrated backshell that accommodates multiple connectors for efficient use of space, simplification of making connections, and added assurance of making the connections at the right places. There is a further need for a strong mechanical connection that can withstand a rigorous vibrational environment.

SUMMARY OF THE INVENTION

The following summary of the invention is provided to facilitate an understanding of some of the innovative features unique to the present invention, and is not intended to be a full description. A full appreciation of the various aspects of the invention can only be gained by taking the entire specification, claims, drawings, and abstract as a whole.

In an exemplary embodiment, a back shell is provided for forming an electrical connection with a cabinet, the backshell comprising at least one electrical connector, such as a D subminiature connector, a deflection arm coupled to one end of the back shell for engaging a cam on a cabinet which holds a receiving connector, and a fastener, for example, a captive mechanical jackscrew, on the opposite end of the backshell from the deflection arm. The deflection arm provides a clamping force when the fastener is fully engaged, and helps form a strong mechanical connection. In another exemplary embodiment, a mechanical jackscrew is provided on both ends of the backshell for securing the backshell to the cabinet.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only and that various changes and modifications within the spirit and scope of the invention will become apparent to those of skill in the art from the detailed description of the invention and claims that follow.

BRIEF DESCRIPTION OF THE DRAWINGS

The subject invention will hereinafter be described in conjunction with the appended drawing figures wherein like numerals denote like elements.

DETAILED DESCRIPTION OF EXEMPLARY EMBODIMENTS

An apparatus and method for using the apparatus in accordance with various aspects of the present invention provide an improved electrical signal connection for avionics related backshells. In this regard, the present invention may be described herein in terms of functional block components and various processing steps. It should be appreciated that such functional blocks may be realized by any number of components configured to perform the specified functions. For example, the present invention may employ various magnetic radiation grounding techniques, such as Deutsch grounding blocks, lug terminations, Tag Rings, and the like. Tag Ring is a brand name for a 360 degree EMI shield produced by Glenair. Furthermore, a variety of mechanical fasteners may be used to secure a backshell to a cabinet. Such general components that are known to those skilled in the art are not described in detail herein. It should further be understood that the exemplary process or processes illustrated may include more or less steps.

Figure 1:
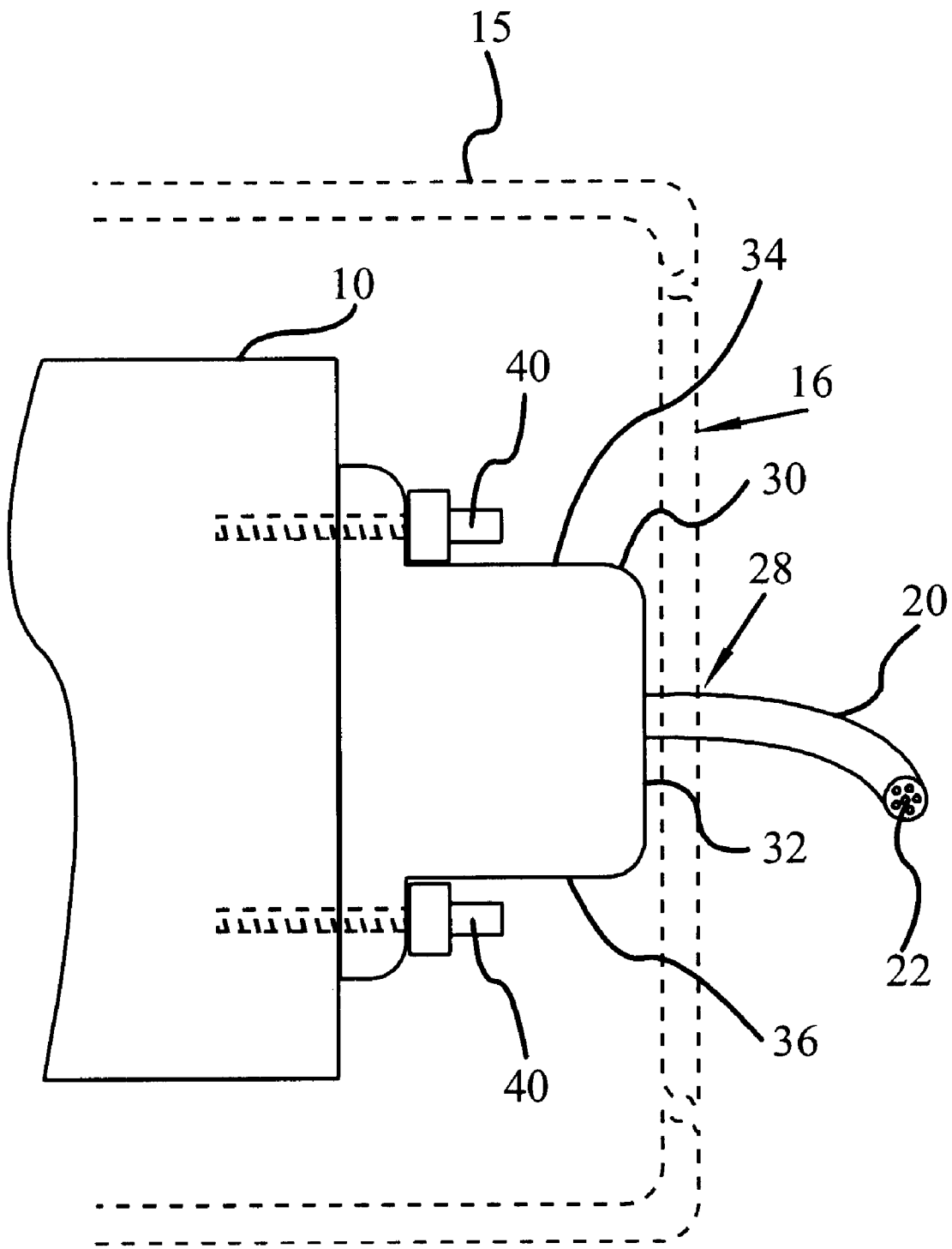
FIG. 1 is a schematic representation of an exemplary connection in the prior art.
Figure 2:
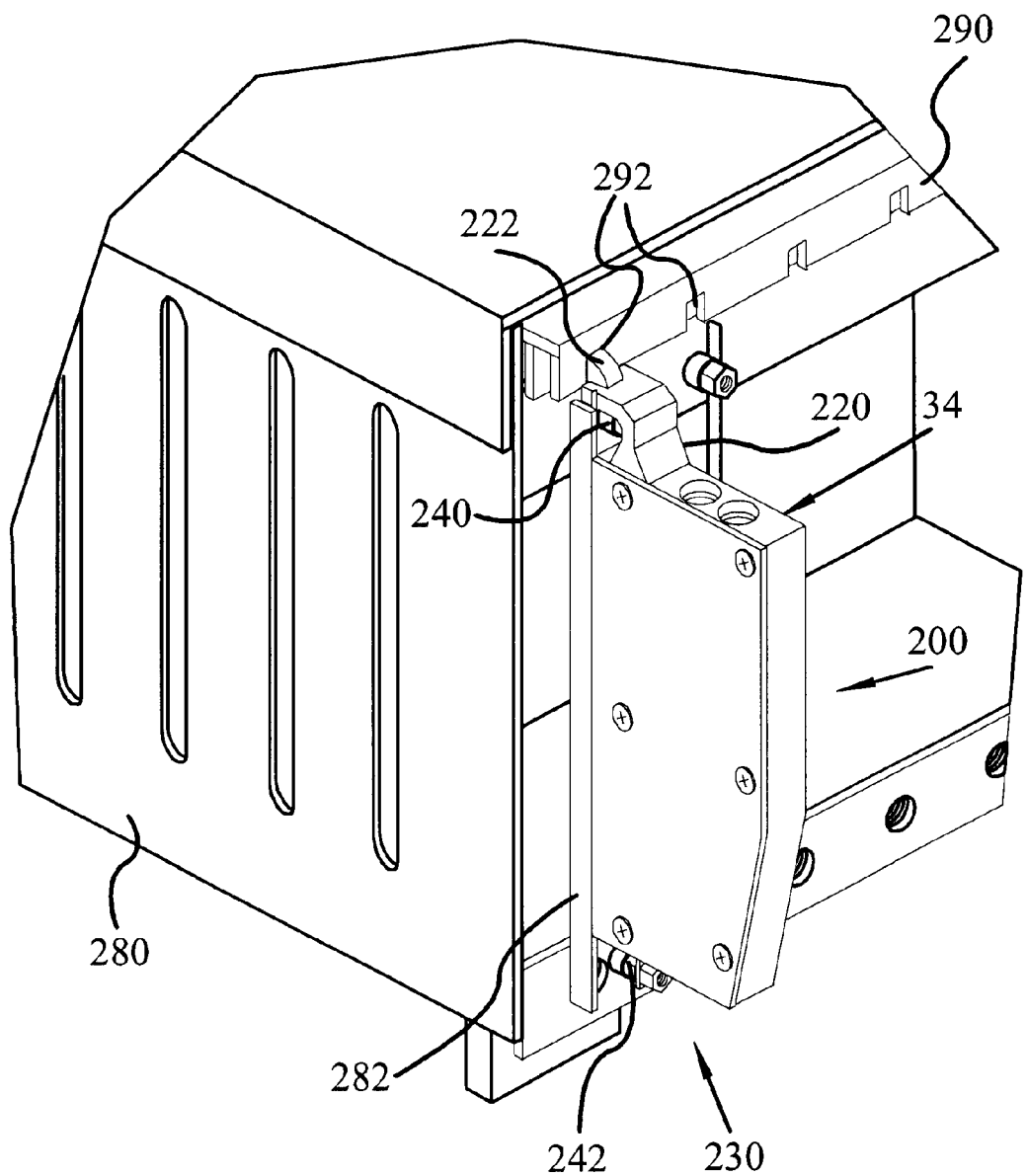
FIG. 2 is a side perspective isometric drawing of an exemplary embodiment of the present invention.

With reference to FIG. 2, the present invention comprises an integrated backshell 200 shown mated to a modular avionics unit (MAU) module or cabinet 280. MAU 280 is made, for example, by Tella Tool & Mfg of Lombard, Ill. The present invention, in one exemplary embodiment, further comprises an electronic signal connection apparatus comprising: a backshell 200 configured to hold an electrical signal connection device, and the backshell 200 further configured to maintain the electrical connection by holding backshell 200 securely to the MAU 280. In one exemplary embodiment, the backshell securing configuration further comprising a first end 34 and a second end 36 opposite the first end, wherein a deflection arm 220 is coupled to the first end 34 and a fastener 230 is coupled to second end 36, and wherein deflection arm 220 and fastener 230 combine to create a clamping force to securely hold backshell 200 to MAU 280.

An exemplary integrated backshell 200 is shown in FIG. 2 in an installed position. Integrated backshell 200 is shown connected to MAU cabinet 280 via an MAU module front plate 282. In this embodiment, the backshell 200 may support two D subminiature connectors associated with two cable bundles. The cable bundles are not shown in this figure for the sake of clarity, but would exit through counter bored clearance holes 210 located at the top end 34 of backshell 200.

It will be noted that because cable bundles exit the top 34 of the backshell 200, it would be very difficult to have access to a bolt or screw for connecting to the top connector 240. Therefore, a deflection arm 220 (or bar) provides an alternative means of making a mechanical connection. Deflection arm 220 engages a cam 290 located at the top portion of MAU cabinet 280. Cam 290, in this embodiment, is bracket-shaped such that deflection arm 220 may be positioned under the bracket portion of cam 290. Of course, other shapes or configurations may be used for cam 290 and deflection arm 220 so long as the two devices may interact to form a clamping force. Cam 290 also contains slots 292 for engaging tabs 222 on deflection arm 220. The slot 292/tab 222 assembly arrangement enables improved alignment in installing backshell 200.

Deflection arm 220 may suitably be made of aluminum alloy in one embodiment of the present invention. Deflection arm 220 may also be made of material such as, for example, 6061-T651 aluminum alloy, spring steel, and beryllium copper. In avionics, materials are often chosen for their light weight, which makes materials such as aluminum favorable for use. Other suitable materials, however may also be used such as, for example, glass, nylon, polycarbon, and carbon-fiber. In one embodiment of the present invention, deflection arm 220 causes a pressure to be created forcing backshell 200 to remain in contact with MAU cabinet 280 when engaged with cam 290. Therefore, deflection arm 220 should preferably be configured to provide the necessary force to constrain the backshell in its mounting under the applied loads as required due to the environment to which the electronics shall be subjected.

In the embodiment shown in FIG. 2, only one fastener 230 is used to secure backshell 200 to the MAU cabinet 280. The fastener is located at the opposite end from deflection arm 220, which in this embodiment is the bottom 36 of backshell 200. This fastener is connected to backshell 200, and may be, for example, a screw-type fastener. Screw 230 engages bottom connector 242 and provides the second pressure point for holding backshell 200 to the MAU cabinet 280. Screw 230 may be, for example, a No. 10 size screw with locking capabilities, such as Part No. 7027042 provided by Honeywell Manufacturer. Other jackscrews and fasteners may be used in other exemplary embodiments.

Figure 3:
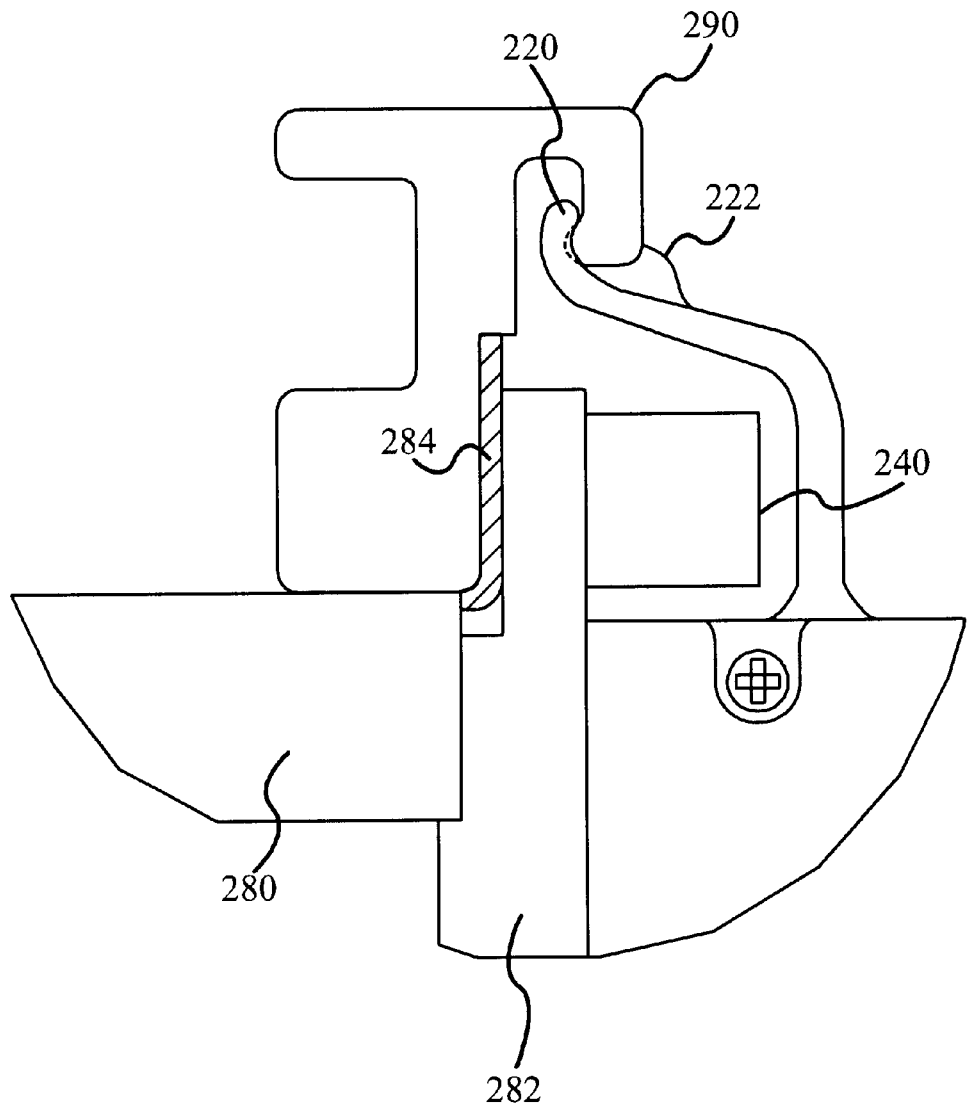
FIG. 3 is a side view of an exemplary embodiment of the present invention.

With reference to FIG. 3, a detailed side view of the preferred relationship between cam 290 and backshell deflection arm 220 is shown. In this view, deflection arm 220 is shown with tab 222 engaging cabinet cam 290. Deflection arm 220 is shown to be preferably shaped such that it clears module jack screw 240 and such that a very small interference (for example, 15 thousandths to 14 thousandths of an inch) is created between the deflection arm 220 and the cabinet cam bar 290. In an exemplary embodiment, the amount of interference is dictated by the clamping force desired to maintain a stable and reliable mechanical and electrical interface. As discussed above, this determination of the desired clamping force may be a function of the vibration environment and backshell vibration response. In some embodiments, resistance to vibration may not be a concern, such as on a shop floor where shock might be more of a concern or shop floor personnel bumping up against the equipment and loosening the electrical connection. This interference will preferably cause an appropriate amount of pressure to be placed on deflection arm 220 to deflect the arm. Also visible in FIG. 3 is the cabinet 280 and a curved portion of cabinet sheet metal 284 which provides added stiffness. MAU module front plate 282 is also visible in FIG. 3.

Figure 4:
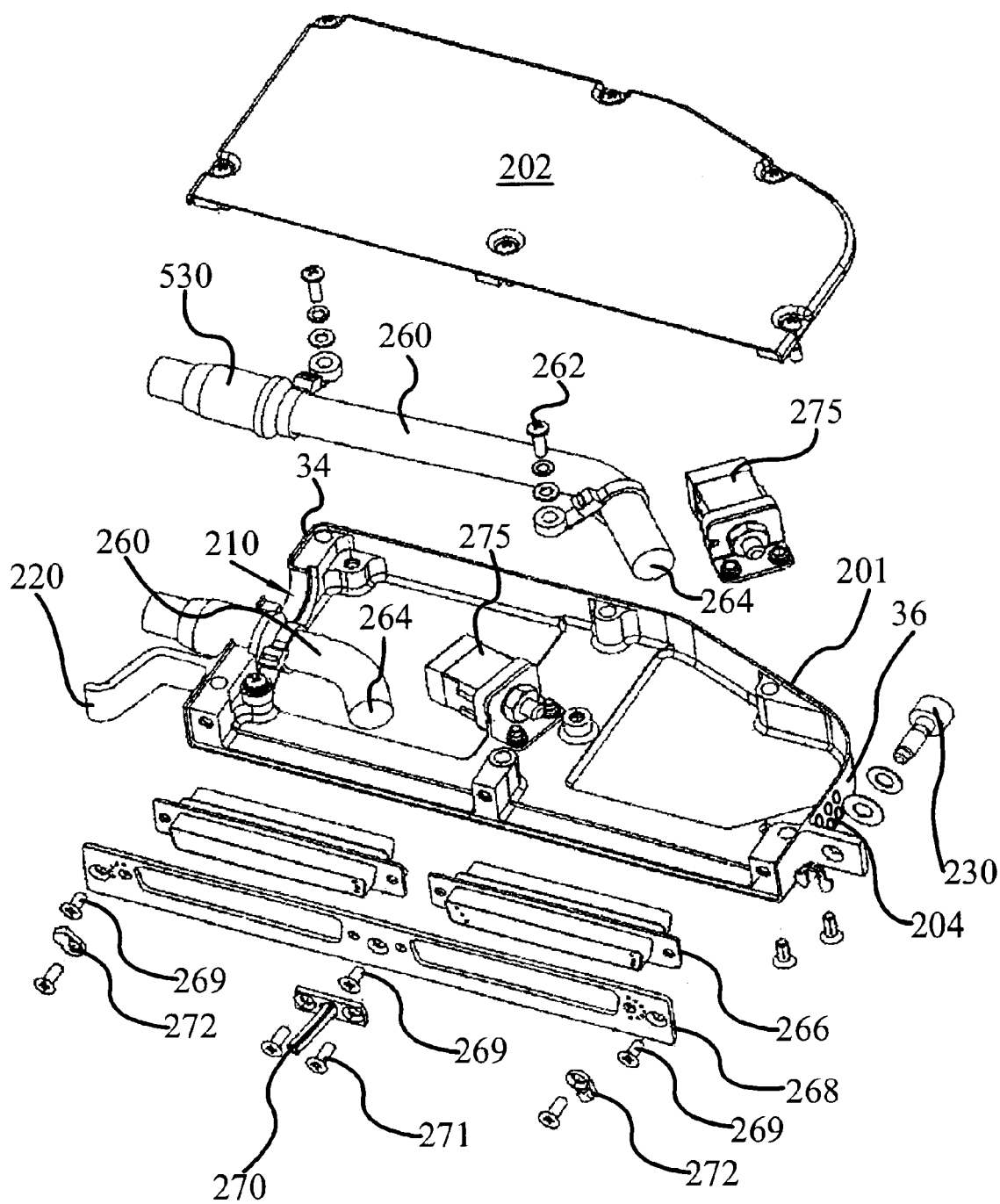
FIG. 4 through FIG. 8 are exploded isometric views of exemplary embodiments of the present invention.

With reference now to FIG. 4, an exploded isometric view of the internal construction of an exemplary backshell 200 is shown. Backshell 200 is made of a base housing 201 with a mated cover 202 which contains all the components internal to the backshell. The housing and cover may be made, for example of 6061-T651 aluminum. Backshell 200 further has a deflection arm 220 formed as an integral part of, or otherwise rigidly attached to, base housing 201 or cover 202. Deflection arm 220 may also be attached in other ways known in the art so long as deflection arm 220 is securely attached to the backshell structure. Jack screw 230 is shown with washers for use in attaching backshell 200 to cabinet 280 as discussed with reference to FIG. 2. Drainage holes 204 are optionally shown in bottom 36 of backshell 200 for providing a drainage route for condensation or any other moisture buildup. Drainage holes make backshell 200 more able to withstand temperature and humidity environmental conditions, as well as shed other moisture which might get into backshell 200. Two cable bundles 260 are shown entering the backshell housing through holes 210 through top 34 of backshell 200.

The "top" 34 and "bottom" 36 of backshell 200 have been identified with reference to one exemplary embodiment. However, those of skill in the art will now realize that deflection arm 220 could be coupled to backshell 200 on either the top or bottom ends of the backshell. Mechanical fastener 230 is generally located at the opposite end of backshell 200 from the end where deflection arm 220 is attached. Furthermore, cable bundles 260 may exit through the top end, bottom end, and rear end of backshell 200. If the cable bundles exit through a top or bottom end, it will be through the deflection arm end to leaving the other end free to allow a person easier access to mechanical fastener 230. The drain may be exclusively used on the bottom of backshell 200 for obvious gravity drainage reasons.

Cable bundle 260 enters backshell 220 through, for example, one or more counter-bored clearance holes 210. Common rubber grommets 530 are installed over cable bundles 260. Grommets 530 fit into clearance holes 210 which conform to the outside dimensions of the grommets 530. A shoulder on grommet 530 mates with a counter-bore in clearance hole 210 to capture grommet 530 and not allow it to work its way out of backshell housing 200. Cable bundles 260 may be secured to base housing 201 in a variety of places using a cable strap and screw assembly 262.

The cable bundles may contain multiple wires 22 (not shown) which exit the cable bundles at 264 and connect to dual D subminiature connectors 266. Typical D subminiature connectors are manufactured by Cannon, AMP, and Positronic and have 62 pins, although other D subminiature connectors may be used such as: 5 pin (power supply with heavy current carrying capability), 9 pin, 26 pin, etc. Furthermore, other D subminiature models may be used such as combination D-Subminiature connectors which combine coax and signal contacts. Two D subminiature connectors 266 are incorporated and held in place in backshell face plate 268 which is connected to backshell housing 201 via screws 269. Furthermore, an alignment pin 270 is provided, for example in the middle of the two D subminiature connectors 266 as shown in FIG. 4 and attached by screws 271.

Alignment pin 270, in one embodiment, has a curvature to it which is dependent upon the geometry of backshell 200 and is constructed such that alignment pin 270 will smoothly rotate for radial insertion into a receiving hole on face plate 282 of MAU module 280. The curvature is due to the rotational nature of making the connection by rotating about the end of deflection arm 220 as backshell 200 is connected and the electrical connection is made. Furthermore, face plate 268 of backshell 200 is supplied with a key 272 and the matching MAU module front plate 282 is set up with matching holes for receiving the key when the proper backshell is connected to the proper MAU module connections. Therefore, alignment pin 270 and alignment tab 222 are configured for simplifying the connection of the backshell 200 to the MAU cabinet, and key 272 is for reducing the possibility of connecting the wrong backshell to a pair of connectors on the MAU module front plate.

The unused space inside the backshell is advantageous for providing Deutsch grounding blocks 275 within backshell 200. In an exemplary embodiment, these grounding blocks comprise Model #CTJ722E01C-6192, available from Deutsch. These Deutsch grounding blocks are tied to ground to dissipate magnetic radiation from the incoming wires 22. The incoming wires 22 in the cable bundles, for example, are preferably surrounded with a metal mesh overbraid which is electrically connected to the Deutsch grounding blocks 275. It is advantageous to be able to provide the Deutsch grounding blocks internally because this improves the long term reliability and the maintenance of the EMI ground path. For example, an internal mount removes the ground shields from exposure to agents in the surrounding environment that could degrade the electrical path to ground. Furthermore, internal Deutsch grounding blocks provide for a "clean" installation with no visible wires, etc. In addition, the "pig tails" associated with the Deutsch grounding blocks are typically short (to be able to ground the high frequency noise), and thus it is advantageous to locate the grounding blocks inside the backshell in close proximity to the wires to be grounded. An alternative grounding or shielding methodology is, for example, to use a band clamp near entry holes 210.

Figure 5:
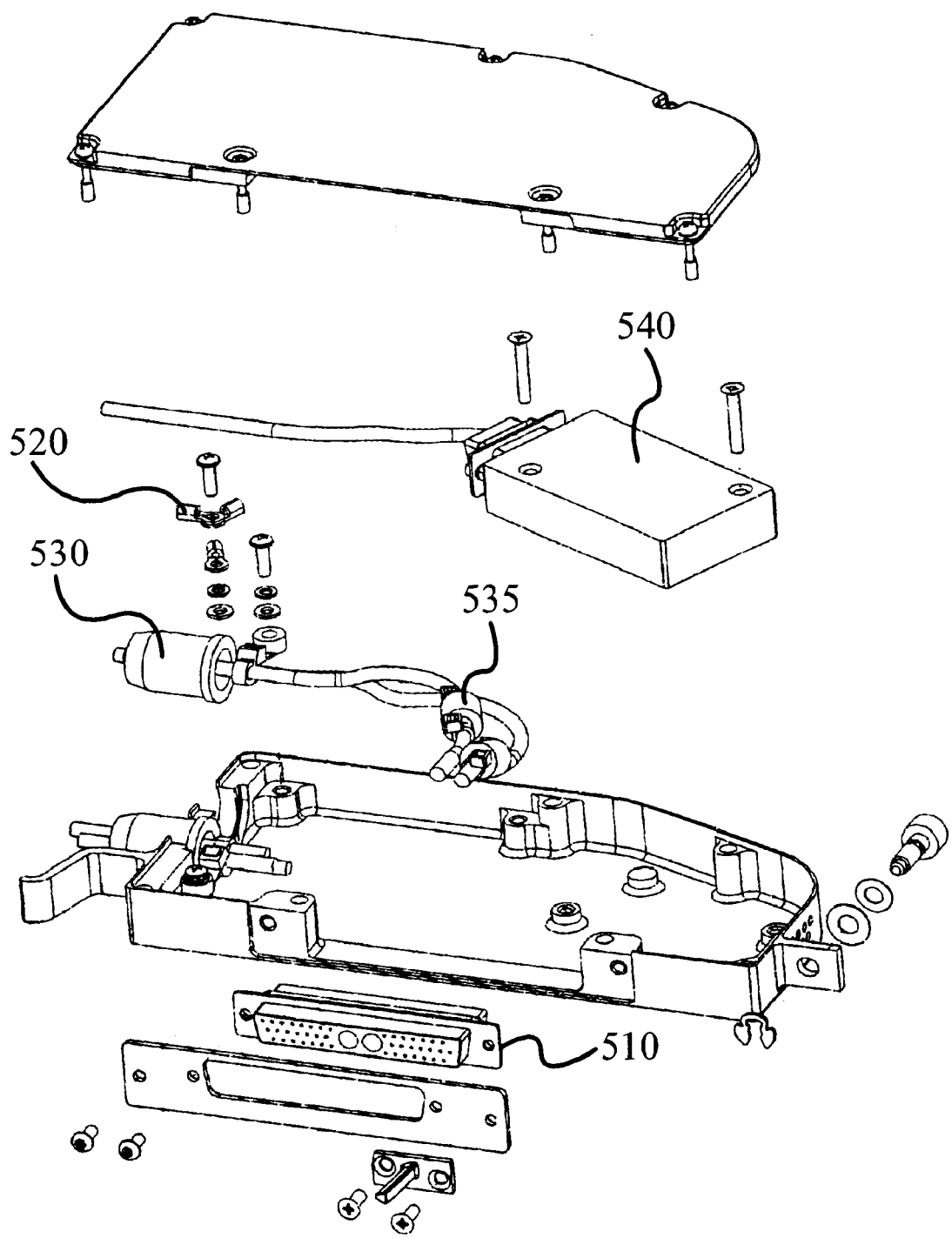

Referring now to FIG. 5, an alternative embodiment is shown with two entries of cable bundles as in FIG. 4 but with only a single D subminiature connector containing coax inserts 510. Other connectors may similarly be used in place of the single D subminiature connectors such as blind mate coax. Although most of the parts shown in FIG. 5 are similar to those shown in FIG. 4, a few differences exist. For example, in place of the Deutsch grounding blocks, the electromagnetic radiation is grounded using ring lug terminals 520. These are located near the standard grommets 530 which are located at the entry to the backshell and surround the entering cable bundles. In an exemplary embodiment, ferrite beads 635 filter out high intensity radio frequency. These ferrite beads 635 are located, for example, on a LAN coax cable. In other exemplary embodiments, a triax cable may be used instead of a coax for the LAN. Thus, many types of wiring and protection means may be well suited for use in alternative embodiments. Furthermore, an aircraft personality module 540, such as one provided by Honeywell, Model No. IM-950, may be provided. This aircraft personality module 540 identifies the electronics, hardware, software, etc., and is used for splicing, cuts and jumpers, such as splitting a signal onto two wires. Devices such as aircraft personality module 540 are conveniently placed inside backshell 200 where space permits.

Figure 6:
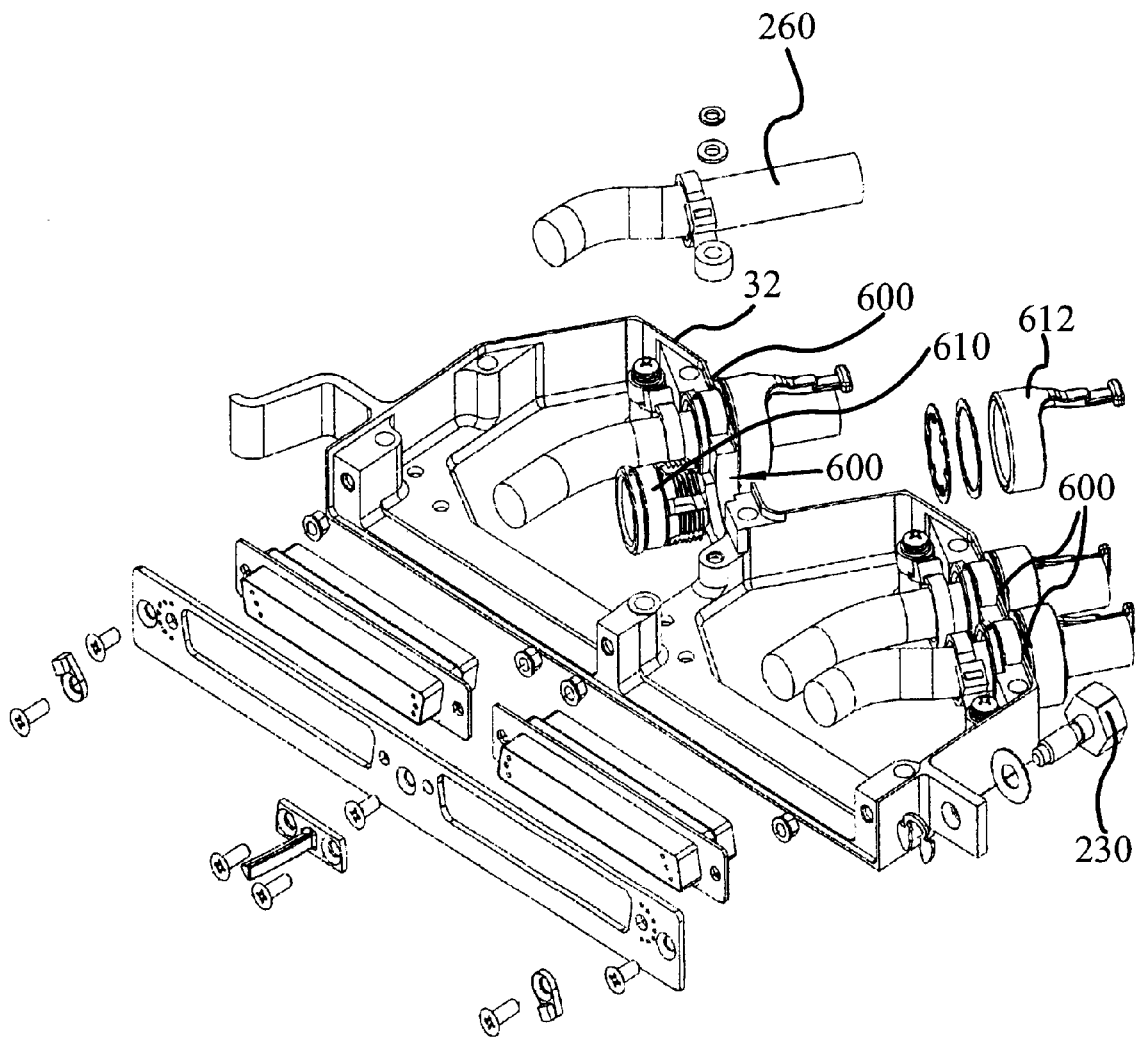

With reference to FIG. 6, other embodiments may be employed consistent with the philosophy of the present discussion, including configuring the exit of cable bundles 260 in such a manner that cable bundles 260 exit neither the top 34 nor bottom 36 of backshell 200, but exit the rear end 32 portion at a predetermined angle so as to provide efficient packaging and space conservation. In this embodiment, cable bundles 260 exit end 32 at a location indicated by reference number 600, and at an angle which facilitates short turning radiuses for reducing the clearance distance required in front of MAU cabinet 280 to fit backshell 200 and the immediately protruding cable bundle 260. Cable bundles 260 enter through Tag Ring castellated nut 610 and tag ring jam nut/cable strain relief 612, manufactured by Glenair. Tag ring 610 provides another means of providing electromagnetic radiation shielding for incoming cable bundles 260. FIG. 6 also shows a hex nut head backshell fastener 230 exemplifying that several different types of fasteners may be used to provide the one mechanical connection point for the typical integrated backshell 200.

Figure 7:
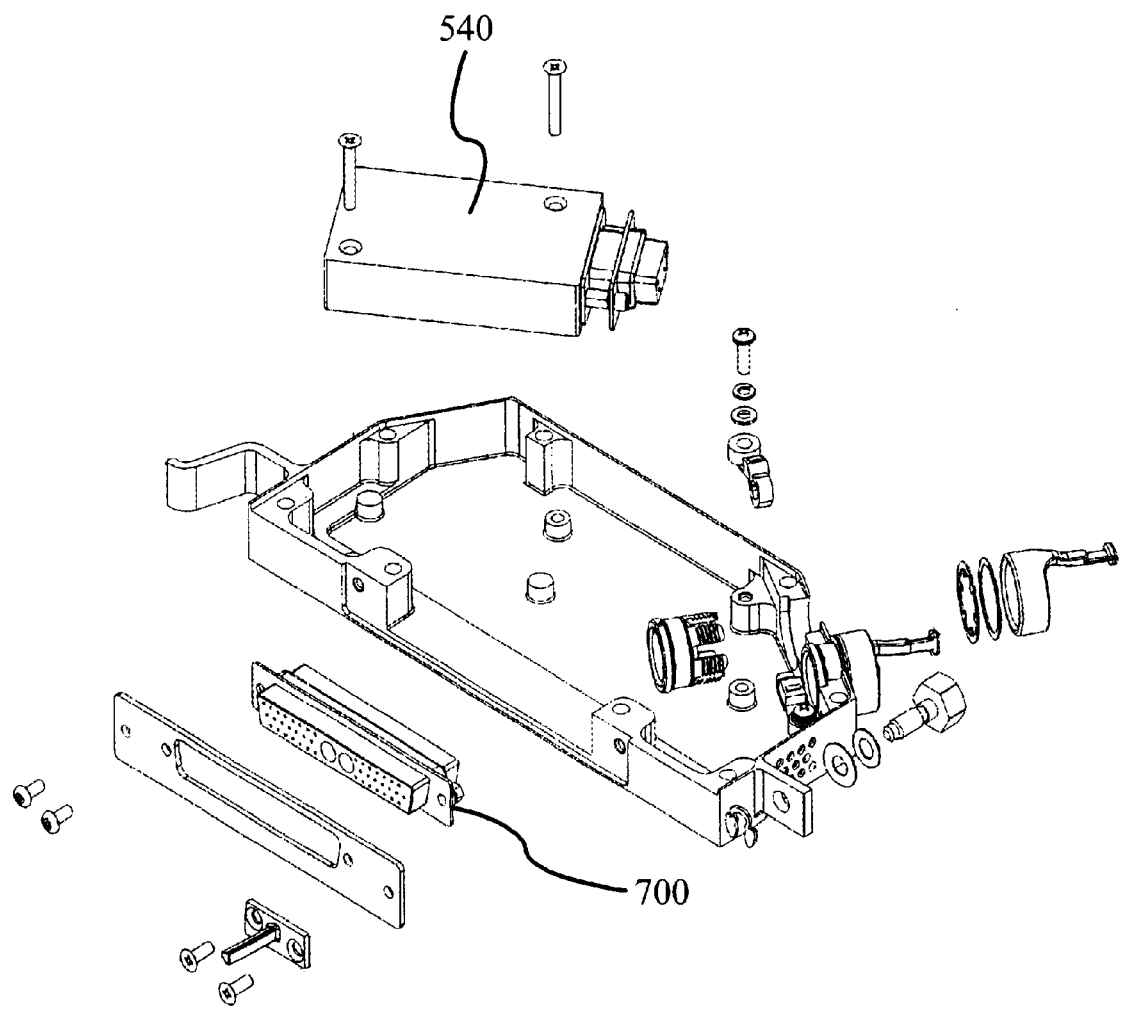

FIG. 7 shows a further exemplary embodiment with a single D subminiature connector 510 with coax center contacts 700 provided in a backshell 200 with a single pair of cable bundles exiting rear end 32 of backshell 200 at an angle similar to that shown in FIG. 6 but with a space large enough to provide an aircraft personality module 540 similar to that discussed with reference to FIG. 5. It is noted that the alignment pin 270 in FIGS. 5 and 7 are located typically near the mechanical fastener end of the D subminiature connector, although any suitable location may be selected for alignment pin 270.

Integrated backshell 200 shields the cable bundle connections to MAU cabinet 280 from the environment. The connections are held together with a clamping force generated by cam 32 and deflection arm 220, in conjunction with mechanical fastener 230. This clamping force, and the use of only one mechanical fastener reduces the chance that vibrations will cause the wires to loosen and disconnect. The strong housing and the drainage holes shield the connecting wires from humidity and other moisture sources, as well as dust and accidental bumps, rubbing, or other wearing. The grommets and cable bundles provide a firm connection to the backshell. The use of a deflection arm allows for expansion and contraction typical when temperatures fluctuate greatly. However, the deflection arm continually maintains a clamping force holding the connection together despite temperature changes and associated material expansion or contraction. Unlike some screws and many other mechanical fasteners, the deflection arm can not loosen due to vibrations, or expansion and contraction.

Integrated backshell 200 also supports multiple D subminiature connectors as well as other standard connectors. Providing multiple connectors in a single housing not only makes the efficient use of available space, but makes it faster for an operator to make the connections, and reduces the opportunity for connection confusion. For example, a person could connect two or three D subminiature connectors at a time, and without concern of getting the cables mixed up and plugged into the wrong slot. Multiple connectors in one backshell are beneficial to not only avionics bay connections, but are beneficial for rack-type equipment and any PCI bus architecture. For example, the present invention may be used on production floors in connection with industrial grade equipment.

Figure 8:
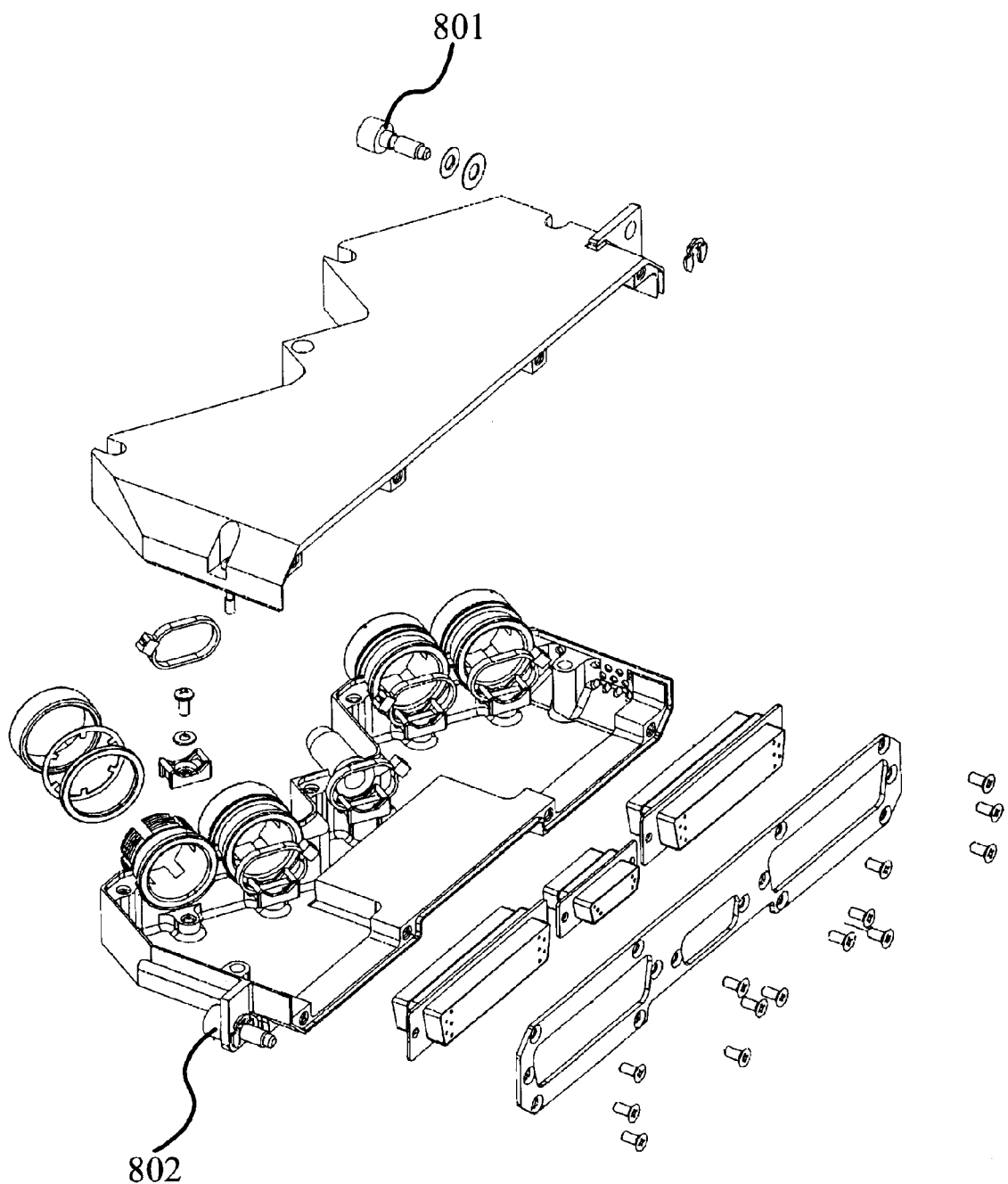

In a further exemplary embodiment, backshell connections may also be made to modular radio cabinet modules and other similar devices. In this exemplary embodiment, the backshell does not use a deflection arm for clamping force, but relies on two or more mechanical jackscrews to create this clamping force. With reference to FIG. 8, an exemplary exploded view of a mechanical backshell is shown with many of the features described herein. For example, the cable bundles in this exemplary embodiment are shown exiting the back of the backshell at an angle and multiple D subminiature connectors are provided within the single backshell. In this embodiment, however, a first fastener 801 and a second fastener 802 are provided for creating a clamping force. The first and second fasteners are, in one embodiment, jackscrews. It will be appreciated, however, that other fasteners which can withstand rigorous vibrations found in aircraft and similar rugged environments may be substituted.

With regard to various aspects of the present invention, a mechanical jackscrew provides a stronger connection than the standard No. 4 size screws used in typical backshell connections. The incorporation of one or more D subminiature connectors into a backshell enables the use of stronger fasteners. The screws 40, of the D subminiature connectors, are not the source of the force that maintains the signal connections. Rather, in this embodiment, fasteners 801 and 802 provide that stronger and more reliable force to maintain constant engagement of the two mating objects. In further aspects of the present invention, and unlike D subminiature screws 40, the choice of fastener is not limited because the cabinet receiving the fastener is designed to receive the selected type of fastener. Furthermore, in other embodiments, other fasteners may be used, such as the deflection arm discussed above and other fasteners which provide similar strength and reliability.

Therefore, the present invention may be useful in challenging environments subjecting the electrical connections to rigorous vibrations, humidity extremes, temperature extremes, and electromagnetic radiation. The device is also useful for PCI bus architectures and rack-type equipment, and may be found useful in many industrial applications. An alignment pin on the backshell and a pin receptacle on the module engage before the connectors to provide the precise alignment required between the mated connector pair. As a backshell completes full connector engagement, the jack screw draws the backshell down against the module surface and develops the full clamping force of the deflection arm.

Other variations and modifications of the present invention will be apparent to those of ordinary skill in the art, and it is the intent of the appended claims that such variations and modifications be covered. The particular values and configurations discussed above can be varied, are cited to illustrate particular embodiments of the present invention and are not intended to limit the scope of the invention. It is contemplated that the use of the present invention can involve components having different characteristics as long as the principle, the space efficient backshell that only requires a single mechanical fastener, is followed.

The following is claimed:

1. An electronic signal connection apparatus for engaging at least one receiving connector coupled to a cabinet equipped with a cam having a plurality of notches therein, said connection apparatus comprising:
   a backshell having a first end and a second end opposite the first end;
   at least one electrical connector within the backshell;
   a deflection arm coupled to the first end for engaging said cam and having a tab for cooperating with at least one of said plurality of notches in said cam to align said electrical connector with said at least one receiving connector; and;
   a fastener coupled to the second end.

2. The apparatus of claim 1 further comprising a cable bundle exiting the backshell through the first end.

3. The apparatus of claim 1 further comprising a cable bundle exiting a rear portion of the backshell at a predetermined angle.

4. The apparatus of claim 1 wherein each electrical connector is a D subminiature type connector.

5. The apparatus of claim 1 further comprising an alignment pin for aligning the connector to a receiving connector; the alignment pin having a curvature for radial insertion into an aligning hole.

6. The apparatus of claim 1 further comprising a key coupled to a face plate on the backshell and a key receiver coupled to a cabinet; the key receiver configured to receive the key.

7. The apparatus of claim 1 wherein the fastener is a jack screw.

8. The apparatus of claim 1 further comprising at least one of the following within the backshell: a Deutsch block, a grounding strap, and an aircraft personality module.

9. The apparatus of claim 1 further comprising a Tag Ring in proximity with the backshell.

10. An electronic signal connection apparatus comprising:
    a cabinet having at least one receiving electrical connector thereon;
    a cam coupled to said cabinet, said cam having a plurality of notches therein;
    a backshell having a first end and a second end opposite the first end;
    at least a first electrical connector coupled to the backshell; and
    a deflection arm coupled to the first end for engaging said cam and having a tab for cooperating with at least one of said plurality of notches in said cam to align said at least one first electrical connector with said at least one receiving electrical connector.

11. The apparatus of claim 10 further comprising a cable bundle exiting the first end.

12. The apparatus of claim 10 further comprising a cable bundle exiting a rear portion of the backshell at a predetermined angle.

13. The apparatus of claim 10 wherein the electrical connector is a D subminiature type connector.

14. The apparatus of claim 10 further comprising an alignment pin configured to align the connector to the receiving connector; the alignment pin having a curvature for radial insertion into an aligning hole.

15. The apparatus of claim 10 further comprising a key coupled to a face plate on the backshell and a key receiver coupled to the cabinet; the key receiver configured to receive the key.

16. The apparatus of claim 10 wherein the fastener is a jack screw.

17. An electrical connection apparatus configured to form at least one electrical connection with a cabinet equipped with a cam having a plurality of notches therein, comprising:
    a backshell having a first end and a second end opposite the first end;
    a deflection arm coupled to the first end for engaging said cam and having a tab for cooperating with at least one of said plurality of notches in said cam to align said backshell; and
    a single fastener coupled to the second end.

18. The apparatus of claim 17 further comprising a cable bundle exiting the backshell through the first end.

19. The apparatus of claim 17 further comprising a cable bundle exiting a rear portion of the backshell at a predetermined angle.

20. The apparatus of claim 17 wherein the electrical connector is a D subminiature type connector.

21. The apparatus of claim 17 further comprising an alignment pin configured to align the connector to a receiving connector; the alignment pin having a curvature configured to be radially inserted into an aligning hole.

22. The apparatus of claim 17 further comprising a key coupled to a face plate coupled to the backshell and a key receiver coupled to a cabinet; the key receiver configured to receive a matching key.

23. The apparatus of claim 17 wherein the fastener is a jack screw.

* * * * *